United States Patent [19]

Wislocky

[11] 4,305,087
[45] Dec. 8, 1981

[54] STUD-MOUNTED PRESSURE ASSEMBLED SEMICONDUCTOR DEVICE

[75] Inventor: Joseph Wislocky, El Segundo, Calif.

[73] Assignee: International Rectifier Corporation, Los Angeles, Calif.

[21] Appl. No.: 53,702

[22] Filed: Jun. 29, 1979

[51] Int. Cl.³ .................. H01L 23/42; H01L 23/44; H01L 23/45
[52] U.S. Cl. ........................... 357/79; 357/74; 357/81
[58] Field of Search ..................... 357/74, 79, 81

[56] References Cited

U.S. PATENT DOCUMENTS

| | | | |
|---|---|---|---|
| 3,513,360 | 5/1970 | Andersson | 357/79 |
| 3,566,209 | 2/1971 | Shaw | 357/79 |
| 3,729,659 | 4/1973 | Bennett | 357/79 |
| 3,743,896 | 7/1973 | Weiske et al. | 357/79 |
| 4,099,201 | 7/1978 | Mueller | 357/79 |
| 4,158,850 | 6/1979 | Lehmann et al. | 357/79 |

Primary Examiner—Andrew J. James
Attorney, Agent, or Firm—Ostrolenk, Faber, Gerb & Soffen

[57] ABSTRACT

A semiconductor wafer having one or more junctions is mounted on the pedestal of a threaded stud. The stud has a hexagonal outer surface and an upstanding hollow cylindrical member which forms an enclosure for the semiconductor wafer. A rigid lead having an enlarged head is placed on top of the wafer and is pressed into contact with the wafer by washer springs that are held under tension by being connected to the outer upstanding cylindrical housing of the stud. Pressure is applied from the washers through an alumina washer which is seated atop a thin mica washer. The thin mica washer ensures insulation in the event that the alumina washer is fractured. Teflon centering rings are provided for centering the molybdenum expansion electrode, the wafer and the enlarged head of the upper electrical conductor in pressure contact with the semiconductor wafer. The centering rings have a suitable annular cutout to receive any outwardly bulging silastic which is used to passivate the junction of the wafer within the package. The molybdenum expansion electrode is loosely mounted and is nickel plated whereby a nickel plated surface makes sliding contact with the aluminum electrode of the semiconductor wafer. Easily machined parts are used throughout the assembly and the parts can be interchangeably used for a forward polarity device or reverse polarity device.

11 Claims, 5 Drawing Figures

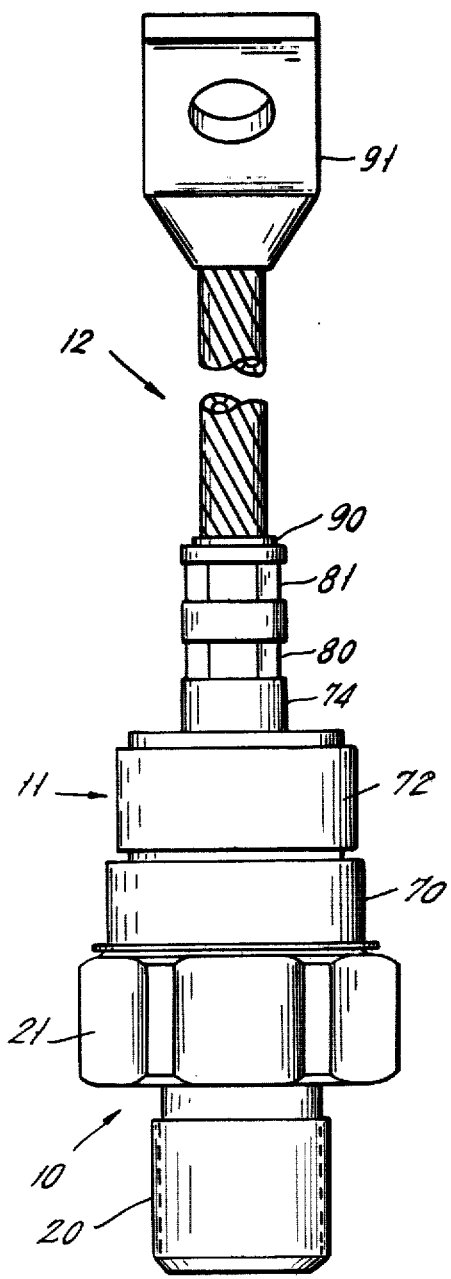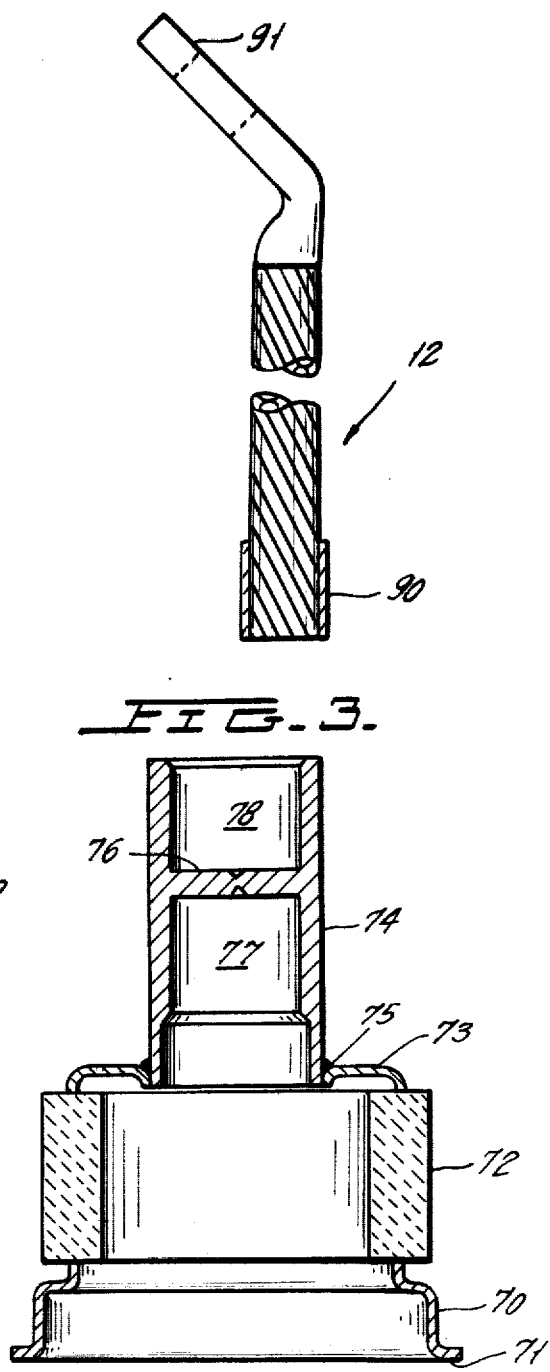

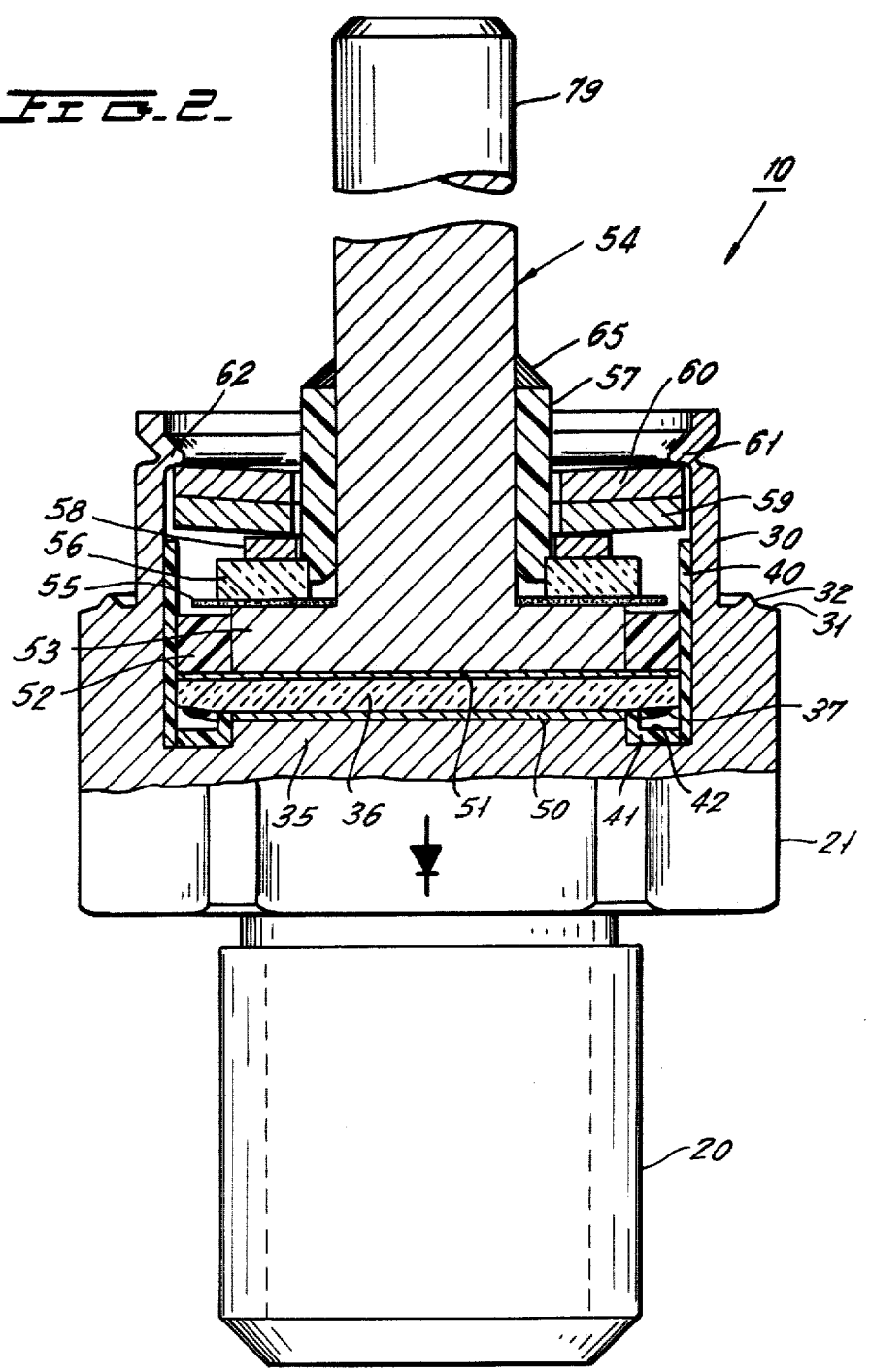

STUD-MOUNTED PRESSURE ASSEMBLED SEMICONDUCTOR DEVICE

BACKGROUND OF THE INVENTION

This invention relates to semiconductor devices and more specifically relates to a novel pressure assembled semiconductor device which is formed within a stud-mounted type housing.

Pressure assembled devices are well known and are manufactured either as flat assemblies having the shape of a short cylinder or as a stud-mounted assembly wherein the device is contained on the base of a threaded stud which can be threaded into connection with a suitable bus. Pressure assembled stud-mounted devices manufactured in the past use complex parts which require expensive machining.

Moreover the devices of the prior art are commonly fully assembled before they can be tested so that a defect detected at the end of the manufacturing cycle can cause an expensive rejection.

BRIEF DESCRIPTION OF THE PRESENT INVENTION

The present invention is for a novel compression bonded assembly which can be used for a stud-mounted housing with a semiconductor junction arranged in the device of the forward or reverse conducting application wherein simple parts are used and wherein the parts permit simplified manufacturing and assembling and testing techniques.

A number of novel individual features are incorporated in the novel assembly which permit the accomplishment of the objects of the invention. Thus, insulation discs are used to locate both the main copper electrode and the molybdenum expansion plate which is a free floating disc relative to the semiconductor wafer or junction. The insulation disc is then provided with a cutout which can receive silastic which bulges outwardly from the tapered portion of the junction.

The molybdenum disc is plated with nickel and the nickel plating makes sliding contact with the aluminum electrode on the facing surface of the semiconductor wafer or "junction".

A further significant feature of the present invention lies in the use of an inexpensive two piece insulation system which includes first, an alumina washer which serves primarily as a pressure pad beneath the Belleville pressure applying washers and second, a central teflon cylinder, which insulates the main copper stud from the Belleville washers. In the past this unit was made as a single T-shaped cross-section piece which was relatively expensive and difficult to manufacture.

A further novel feature of this invention lies in the use of a novel back-up mica washer beneath the alumina disc which is used to transmit pressure to the wafer assembly. The thin back-up washer provides insulation between the copper stud and the steel pressure assembly in the event that the alumina washer cracks and cannot provide the necessary electrical insulation even though the alumina washer is still capable of mechanically transmitting force to the semiconductor wafer.

BRIEF DESCRIPTION OF THE DRAWINGS

FIG. 1 is a elevation view of a final device which has been manufactured in accordance with the present invention.

FIG. 2 is a partial cross-sectional view of the base and junction subassembly of the device of FIG. 1 for a forward polarity type device.

FIG. 3 is a cross-sectional view of the hermetic seal assembly which is applied to the top of the subassembly of FIG. 2 when forming the assembly of FIG. 1.

FIG. 4 is a plan view of the external flexible lead for the assembly of FIG. 1.

DESCRIPTION OF THE PREFERRED EMBODIMENTS

Figure 5:
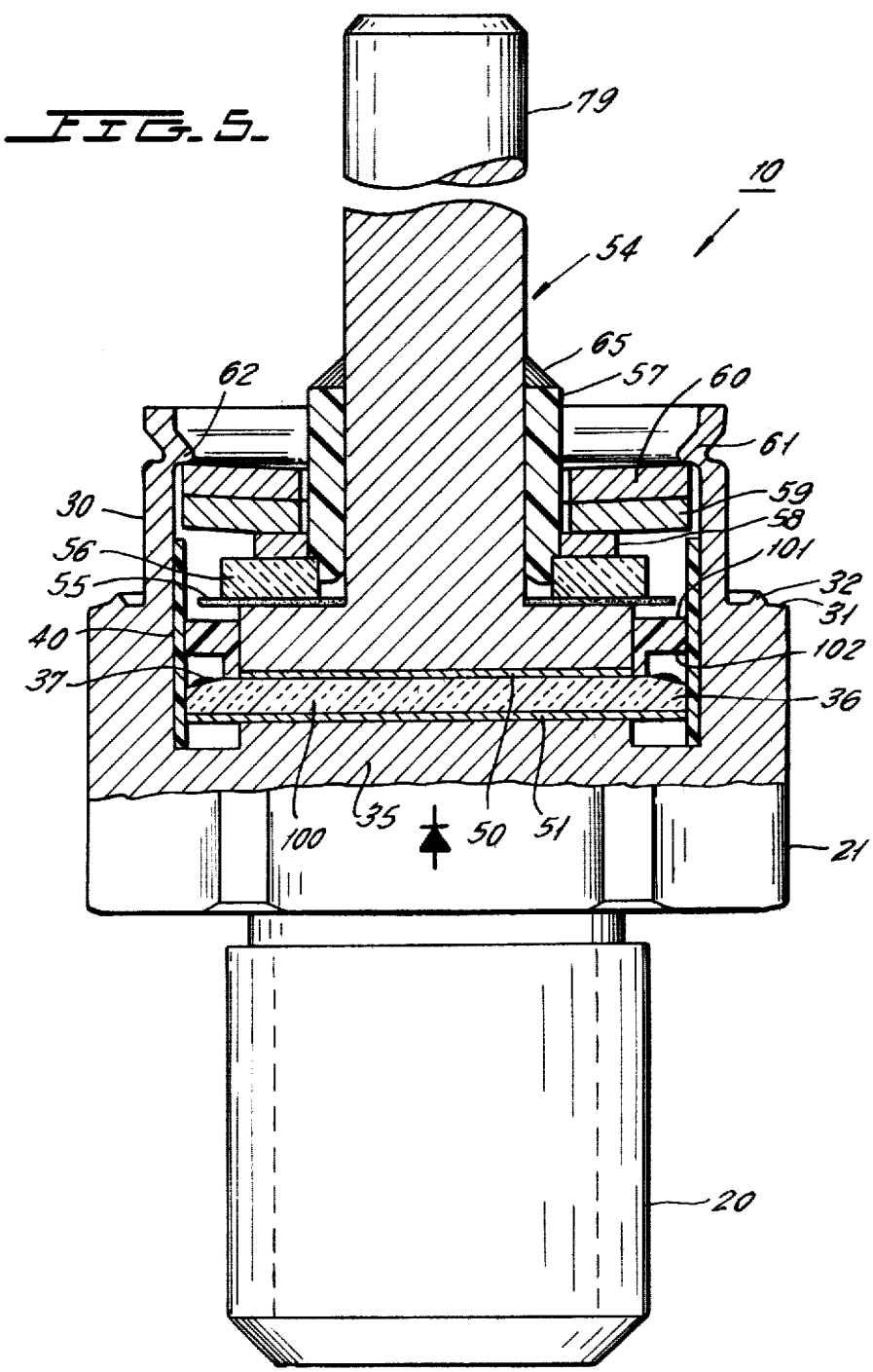
FIG. 5 is a view similar to that of FIG. 2 but showing the device as a reverse polarity device rather than a forward polarity device.

Referring first to FIG. 1, there is shown the assembled semiconductor device of the invention where the device consists of a base and junction subassembly 10, a hermetic seal upper assembly 11 and a flexible lead 12. The lower subassembly 10 consists of a threaded stud 20 and a hexagonal base flange portion 21 with the base made of any suitable material such as copper.

The base assembly 10 is best shown in FIG. 2 for the case of a forward polarity device and it is seen in FIG. 2 that the base contains an integral hollow cylindrical section 30 which extends upwardly from an outer shoulder 31 which contains a welding projection 32. Preferably upstanding cylinder portion 30 and welding projection 32 are formed of low carbon steel inserts which are appropriately secured to the copper body of the base 21.

Copper base 21 contains an upstanding central pedestal region which will receive the main semiconductor junction assembly 36 which can be a diode device or the like which has been fully formed. The junction 36 is arranged for a forward polarity device in the embodiment of FIG. 2 and its lower surface is tapered in the usual manner and the lower surface is passivated with a silastic ring 37 in the usual manner. The lower surface of junction 36 has a flat aluminum electrode thereon.

The inner diameter of the silastic ring is greater than the outer diameter of the pedestal 35 as shown in FIG. 2. The interior of the walls of the cylinder 30 of the stud receives a simple Teflon cylinder 40 which is preferably of virgin Teflon and which serves as the junction positioning ring for positioning the junction 36 relative to the pedestal 35. A molybdenum disc-positioning ring 41 is then positioned around the pedestal 35 as illustrated where the ring 41 is again of virgin Teflon. Ring 41 has an annular cutout region 42 which makes room for the silastic ring 37 which might bulge outwardly from the junction 36.

Ring 41 has an internal cylindrical portion which extends above the height of the top of pedestal 35 and serves to position a molybdenum disc 50 on the pedestal 35. Disc 50 has a nickel plating thereon to ensure a sliding nickel-to-aluminum interface between disc 50 and junction 36. Preferably molybdenum disc 50 will have a very thin gold facing on the surface thereof facing toward the pedestal 35 to ensure good electrical connection to the pedestal 35 due to compression forces which will be later described. The junction 36 is then disposed atop the molybdenum disc 50.

A silver disc 51 of high purity and having a thickness for example of about 3 mils and a diameter equal to the diameter of the junction 36 (about 0.9 inches) is then placed atop the junction 36 and a Teflon ring 52 is laid atop the disc 51. Teflon ring 52 is preferably of virgin Teflon and acts to center the enlarged head 53 of the upper central conductor 54 over the junction assembly.

The enlarged head 53 then receives a thin mica washer 55 which extends beyond the periphery of the head 53 and may have a thickness, for example, of 10 mils. An alumina ceramic insulator washer 56 is then placed over the mica washer 55 and is centered by a central cylindrical insulator 57 which may be of virgin Teflon. Note that the bottom of insulator 57 has a shoulder which fits into the inner diameter of the alumina washer 56.

A steel pressure washer 58 is then placed atop the alumina washer 56 and two high temperature Belleville washers 59 and 60 are placed atop the pressure washer 58 as shown.

The subassembly with the components stacked as described above is then placed in a suitable jig and force is applied to the upper washer 60 to a desired degree. The wall of upstanding cylindrical portion 30 is then staked at a plurality of locations such as the staked locations 61 and 62 in FIG. 2 in order to fix the compression of the washers 59 and 60 to the preset value and to hold the subassembly together.

A silastic annular bead 65 is applied between the upper end of the Teflon cylinder 57 and the surface of the central conductor 54 to prevent the Teflon cylinder 57 from slipping out of the ceramic washer 56.

It should be observed that all of the parts which go into the above subassembly have a relatively simple structure and can be easily manufactured and assembled. Thus, the subassembly can be easily tested just before the staking regions 61 and 62 are formed and after the assembly force is applied in the force-applying jig. If there are defects, the defective part can be replaced with minimum loss of components. The test is then repeated after staking.

The hermetic seal for sealing the subassembly of FIG. 2 is shown in FIG. 3. This seal consists of a subassembly which contains a steel flange member 70 having a welding flange 71 which will seat directly atop the welding projection 32 in FIG. 2 in order to weld the two subassemblies together. The flange 70 is secured in any desired manner to the ceramic ring 72 which has a metallic cup 73 secured to its upper end. The cup 73 is in turn secured to a conductive tube 74 by brazing through the use of the brazing ring 75.

The tube 74 has a central web 76 which defines two cavities 77 and 78 on opposite sides. The cavity 77 during assembly will receive the upper end 79 (FIG. 2) of the central conductor 54 of subassembly 10 while the cavity 78 will receive one end of the flexible lead 12 of FIGS. 1 and 4. The two cavities 77 and 78 are then crimped as shown by the crimp sections 80 and 81, respectively, in FIG. 1 to electrically connect conductor 54 and the flexible connector 12. Note that a hermetic seal is formed around the junction 36 when the assembly is completed. The assembly should be made in a suitable inert gas or the like to ensure cleanliness within the sealed housing.

The flexible conductor 12 as shown in FIG. 4 has a conductive band 90 secured at one end thereof which is received in the cavity 78 and has a suitable terminal lug 91 at its other end. Conductor 12 can be formed of any conventional stranded rope type conductor.

In the above assembly, it will be observed that the Teflon washer 52 is used to locate the copper electrode 54 within the assembly and that the Teflon washer 41 is used to locate the floating molybdenum disc 50 within the assembly. The washer 41 contains the cutout 42 to enable its use with junctions having the bulging silastic disc 37.

Moreover, an inexpensive two piece insulation system is provided to ensure insulation between the copper central conductor 54 and the stud 21. This two piece insulation system includes the alumina washer 56 and the Teflon cylinder 57 which can each be easily and inexpensively manufactured. They provide the necessary insulation to prevent a conductive path from the outer casing 30 through the Belleville washers 59 and 60 and steel washer 58 to the copper member 54.

The novel assembly also contains the mica washer 55 beneath the alumina washer 56. The mica washer ensures dielectric integrity even though the alumina washer 56 cracks but still transmits mechanical pressure between the Belleville washers 59 and 60 and the enlarged diameter region 53 of the central conductor 54.

All of these features are of importance in the production of the novel and inexpensive housing arrangement of the invention.

The assembly of FIG. 2 can be used with minor changes in components for a reverse polarity assembly. Thus, in FIG. 5 there is shown a base and junction subassembly with the semiconductor wafer or junction in a position inverted from that of junction 36 of FIG. 2. All parts in FIG. 5 having numerals similar to those of FIG. 2 are identical to the parts of FIG. 2. In FIG. 5, however, the tapered surface of wafer 36 faces upwardly as does its silastic ring 37. The silver disc 51 of FIG. 2 is disposed on the bottom of the junction 100 in FIG. 5 and the molybdenum disc 50 of FIG. 2 is disposed on the top of the junction in FIG. 5. The Teflon positioning ring 101 in FIG. 5 has the cutout 102 and serves the function of the ring 41 with its cutout 42 in FIG. 2 of positioning the free floating molybdenum disc 50 while providing room for the silastic ring 37. In all other respects the arrangement of FIG. 5 is identical to that of FIG. 2 and all of the advantages previously stated for the arrangement of FIG. 2 are continued in the arrangement of FIG. 5.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A stud mounted pressure assembled device comprising: a base stud having an upstanding cylindrical wall enclosing a central raised pedestal at the base of said wall; a semiconductor junction disposed atop said pedestal and in surface-to-surface engagement therewith; a central conductor having an enlarged flange at the end thereof; the end surface of said enlarged flange engaging the surface of said junction which is opposite from the surface of said junction engaged by said pedestal; insulation washer means disposed on the surface of said flange which faces away from said junction including an insulation cylinder surrounding said central conductor and an insulation washer engaging said flange and one end of said insulation cylinder; an additional thin insulation washer disposed between said ceramic washer and said flange; separate pressure washer means having an internal diameter portion thereof connected to said insulation washer and an external diameter portion thereof connected to said upstanding cylindric wall; said insulation washer means insulating said pressure washer means from said central conductor and its said flange; and a hermetic sealing cap for hermetically enclosing said junction within said base stud.

2. The device of claim 1 which further includes spacer insulation disc means surrounding said flange and disposed atop said junction locating said flange within said base stud.

3. The device of claim 2 wherein said junction has a silastic ring on the surface thereof and wherein said spacer insulation disc means has a cutout annular region for receiving said silastic ring.

4. The device of claim 1 which further includes insulation cylinder means for enclosing the outer periphery of said junction and locating said junction on said pedestal.

5. The device of claim 1 or 4 which further includes a metallic expansion disc disposed adjacent one surface of said junction; and insulation washer means engaging the outer periphery of said expansion disc for locating said expansion disc centrally with respect to said junction.

6. The device of claim 5 wherein said junction has a silastic ring on the surface thereof and wherein said insulation washer means has a cutout annular region for receiving said silastic ring.

7. The device of claim 1 wherein said insulation washer is a ceramic.

8. The device of claim 1 wherein said thin insulation wire is of mica.

9. The device of claim 3 which further includes a metal expansion disc disposed adjacent one surface of said junction; said spacer insulation disc means having an internal opening for receiving and centering said metal expansion disc as well as said flange relative to said junction.

10. The device of claim 5 wherein said expansion disc has a nickel coating on at least one surface thereof; said one surface of said junction having an aluminum electrode and being in sliding contact with said nickel coating on said expansion disc.

11. The device of claim 10 wherein said surface of said expansion disc opposite said at least one surface has a conductive metal facing thereon.

* * * * *